(12) United States Patent
Lai

(10) Patent No.: US 9,148,141 B2
(45) Date of Patent: Sep. 29, 2015

(54) LAYOUT STRUCTURE OF CAPACITIVE TOUCH PANEL AND MANUFACTURING METHOD THEREOF

(75) Inventor: Chih-Chang Lai, Taichung (TW)

(73) Assignee: Novatek Microelectronics Corp., Hsinchu (TW)

( * ) Notice: Subject to any disclaimer, the term of this patent is extended or adjusted under 35 U.S.C. 154(b) by 695 days.

(21) Appl. No.: 13/196,913

(22) Filed: Aug. 3, 2011

(65) Prior Publication Data

US 2012/0298428 A1 Nov. 29, 2012

(30) Foreign Application Priority Data

May 27, 2011 (TW) .............................. 100118699 A

(51) Int. Cl.
| | |
|---|---|
| *G08C 21/00* | (2006.01) |
| *H05K 13/00* | (2006.01) |
| *H03K 17/96* | (2006.01) |
| *G06F 3/044* | (2006.01) |

(52) U.S. Cl.
CPC ............ *H03K 17/9622* (2013.01); *G06F 3/044* (2013.01); *H03K 2017/9602* (2013.01); *Y10T 29/49155* (2015.01)

(58) Field of Classification Search
USPC .......... 345/173–178; 178/18.01–18.09, 18.11
See application file for complete search history.

(56) References Cited

U.S. PATENT DOCUMENTS

| | | | | |
|---|---|---|---|---|
| 2009/0160824 | A1* | 6/2009 | Chih-Yung et al. ........... | 345/175 |
| 2011/0134055 | A1* | 6/2011 | Jung et al. .................... | 345/173 |

FOREIGN PATENT DOCUMENTS

| | | |
|---|---|---|
| CN | 101685362 | 3/2010 |
| CN | 101699377 | 4/2010 |
| CN | 102200858 | 9/2011 |
| TW | M383160 | 6/2010 |
| TW | 201109774 | 3/2011 |

OTHER PUBLICATIONS

"Office Action of Taiwan Counterpart Application", issued on Jan. 16, 2013, p. 1-p. 7.
"Office Action of China Counterpart Application", issued on Sep. 29, 2014, p. 1-p. 6.

* cited by examiner

*Primary Examiner* — Jeffrey Steinberg
(74) *Attorney, Agent, or Firm* — Jianq Chyun IP Office

(57) ABSTRACT

A layout structure of a capacitive touch panel including a conductive layer, an insulation layer, and a plurality of electric bridges is provided. The conductive layer disposed on a substrate includes a plurality of first touch units and a plurality of second touch units. The first touch units are electrically connected with each other through a plurality of connecting sections to form a plurality of first touch series extended along a first direction. The insulation layer is disposed on the conductive layer. Each electric bridge includes a compensation portion, a first crossover portion, and a second crossover portion. The compensation portions are respectively disposed on the connecting sections. The first and second crossover portions are disposed on the insulation layer. The second touch units are electrically connected with each other through the first and second crossover portions to form a plurality of second touch series extended along a second direction.

6 Claims, 10 Drawing Sheets

LAYOUT STRUCTURE OF CAPACITIVE TOUCH PANEL AND MANUFACTURING METHOD THEREOF

CROSS-REFERENCE TO RELATED APPLICATION

This application claims the priority benefit of Taiwan application serial no. 100118699, filed May 27, 2011. The entirety of the above-mentioned patent application is hereby incorporated by reference herein and made a part of this specification.

BACKGROUND OF THE INVENTION

1. Field of the Invention

The invention generally relates to a touch panel, and more particularly, to a layout structure of a capacitive touch panel and a manufacturing method thereof.

2. Description of Related Art

Along with the development of the touch panel technology, touch panels have been broadly applied as screens of electronic devices, such as cell phones, notebook computers, and tablet PCs. These touch panels allow users to carry out input and other operations conveniently and make the user interfaces more intuitional and convenient.

In a conventional touch panel, two touch series arranged in different directions are usually disposed on the input interface to accomplish the touch control function. However, along with the increase in the size of a touch panel, the length of the touch series also increases. As a result, the impedance of these touch series becomes too large and the touch sensitivity of the touch panel is reduced.

SUMMARY OF THE INVENTION

Accordingly, the invention is directed to a layout structure of a capacitive touch panel and a manufacturing method thereof, wherein the impedance of touch series is reduced so that the touch sensitivity of the capacitive touch panel is improved.

The invention provides a layout structure of a capacitive touch panel. The capacitive touch panel includes a conductive layer, an insulation layer, and a plurality of electric bridges. The conductive layer is disposed on a substrate. The conductive layer includes a plurality of first touch units and a plurality of second touch units. The first touch units are electrically connected with each other through a plurality of connecting sections, so as to form a plurality of first touch series extended along a first direction. The insulation layer is disposed on the conductive layer. Each of the electric bridges includes a compensation portion, a first crossover portion, and a second crossover portion. The compensation portions are respectively disposed on the connecting sections, and the first crossover portions and the second crossover portions are disposed on the insulation layer. The second touch units are electrically connected with each other through the first crossover portions and the second crossover portions, so as to form a plurality of second touch series extended along a second direction.

According to an embodiment of the invention, the insulation layer includes a plurality of first insulation patterns and a plurality of second insulation patterns, and the first crossover portions and the second crossover portions are respectively disposed on the first insulation patterns and the second insulation patterns.

According to an embodiment of the invention, the first insulation patterns and the second insulation patterns are respectively disposed at both sides of the connecting sections and are substantially perpendicular to the connecting sections.

According to an embodiment of the invention, the compensation portion is located between the first crossover portion and the second crossover portion and is substantially perpendicular to the first crossover portion and the second crossover portion.

According to an embodiment of the invention, the geometric shape of the first crossover portion is the same as the geometric shape of the second crossover portion.

According to an embodiment of the invention, the widths of the compensation portion, the first crossover portion, and the second crossover portion are all smaller than or equal to 100 μm.

The invention also provides a manufacturing method of a capacitive touch panel. The manufacturing method includes following steps. First, a substrate is provided. Then, a conductive layer is disposed on the substrate, wherein the conductive layer includes a plurality of first touch units and a plurality of second touch units, and the first touch units are electrically connected with each other through a plurality of connecting sections so as to form a plurality of first touch series extended along a first direction. Next, an insulation layer is disposed on the conductive layer. After that, a plurality of electric bridges is disposed on the conductive layer. Each of the electric bridges includes a compensation portion, a first crossover portion, and a second crossover portion. The compensation portions are respectively disposed on the connecting sections, and the first crossover portions and the second crossover portions are disposed on the insulation layer. The second touch units are electrically connected with each other through the first crossover portions and the second crossover portions so as to form a plurality of second touch series extended along a second direction.

As described above, in embodiments of the invention, the compensation portions of the electric bridges are disposed on the connecting sections between the first touch units, and the second touch units are electrically connected with each other through the first crossover portions and the second crossover portions of the electric bridges. Thus, the layout structure and the manufacturing method of the capacitive touch panel described above can reduce the impedances of the first touch series and the second touch series in the first direction and the second direction and accordingly can improve the touch sensitivity of the capacitive touch panel.

These and other exemplary embodiments, features, aspects, and advantages of the invention will be described and become more apparent from the detailed description of exemplary embodiments when read in conjunction with accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
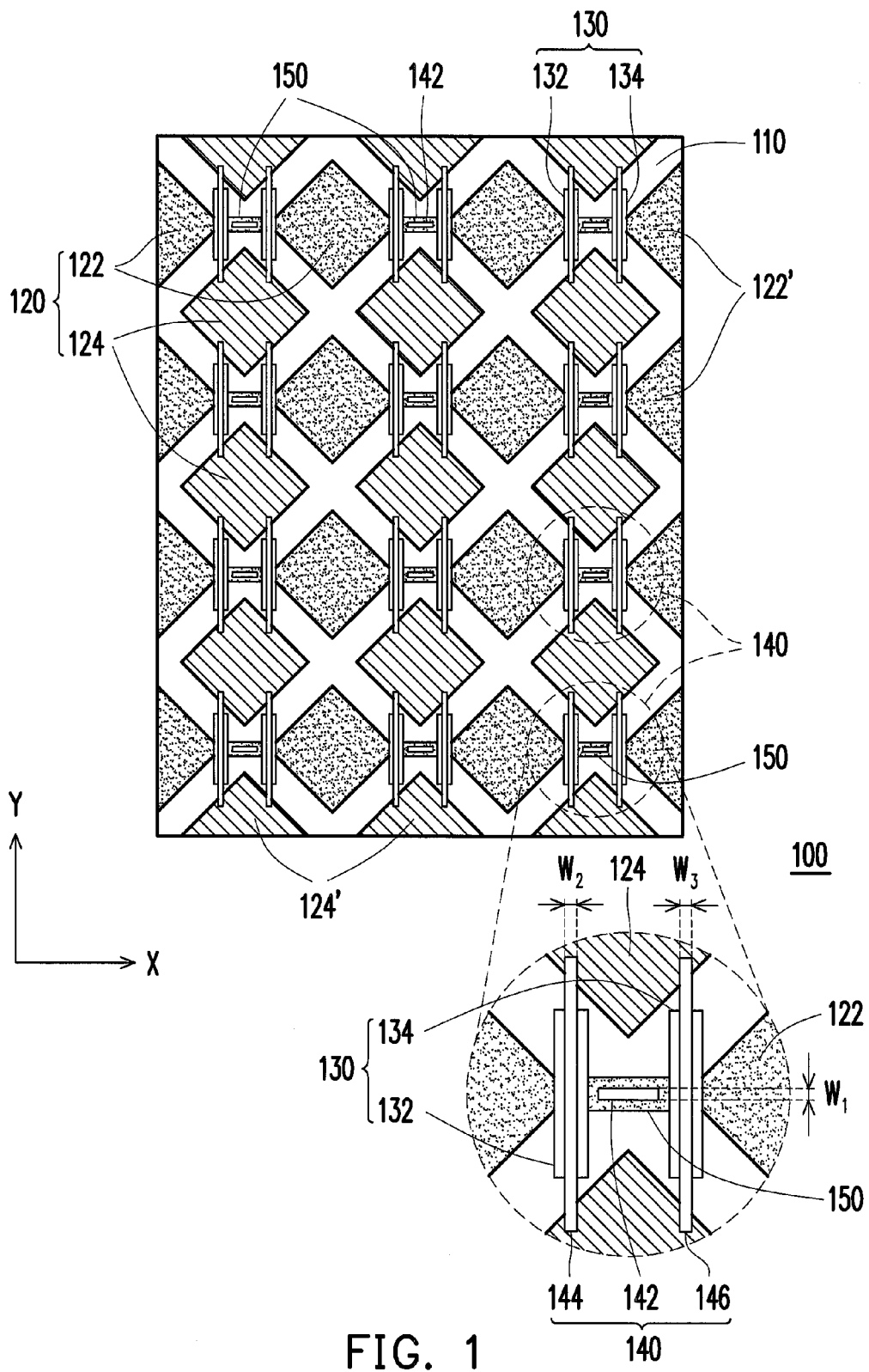
FIG. 1 is a diagram of a layout structure of a capacitive touch panel according to a first embodiment of the invention.

Reference will now be made in detail to the present preferred embodiments of the invention, examples of which are illustrated in the accompanying drawings. Wherever possible, the same reference numbers are used in the drawings and the description to refer to the same or like parts.
First Embodiment FIG. 1 is a diagram of a layout structure of a capacitive touch panel according to the first embodiment of the invention. Referring to FIG. 1, the layout structure of the capacitive touch panel 100 includes a conductive layer 120 disposed on a substrate 110, an insulation layer 130, and a plurality of electric bridges 140. In the present embodiment, the substrate 110 is made of a transparent material, such as polycarbonate (PC), polyethylene (PE), polyethylene terephthalate (PET), polymethyl methacrylate (PMMA), or glass.

The conductive layer 120 includes a plurality of touch units 122 and a plurality of touch units 124. The touch units 122 are electrically connected with each other through a plurality of connecting sections 150, so as to form a plurality of touch series 122' extended along a first direction (for example, the direction X). In the present embodiment, the conductive layer 120 may be made of indium-tin oxide (ITO) or a metal material. The insulation layer 130 is disposed on the conductive layer 120. Each electric bridge 140 includes a compensation portion 142, a crossover portion 144, and a crossover portion 146. The compensation portions 142 are respectively disposed on the connecting sections 150. The crossover portions 144 and the crossover portions 146 are disposed on the insulation layer 130. The touch units 124 are electrically connected with each other through the crossover portions 144 and the crossover portions 146 so as to form a plurality of touch series 124' extended along a second direction (for example, the direction Y). As shown in FIG. 1, the capacitive touch panel 100 in the present embodiment may be a 4×5 capacitive touch panel. Namely, each touch series 122' includes four touch units 122, and each touch series 124' includes five touch units 124.

Additionally, the compensation portion 142 of each electric bridge 140 is located between the crossover portion 144 and the crossover portion 146 and is substantially perpendicular to the crossover portion 144 and the crossover portion 146. In the present embodiment, the geometric shape (for example, a rectangular shape) of the crossover portions 144 is the same as the geometric shape of the crossover portions 146. When the electric bridges 140 are fabricated by using a metal material, since the metal material is not light-transmissive, the widths of the compensation portions 142, the crossover portions 144, and the crossover portions 146 should be limited to make them unnoticeable to human eyes. For example, in the present embodiment, the width $W_1$ of the compensation portions 142, the width $W_2$ of the crossover portions 144, and the width $W_3$ of the crossover portions 146 are all smaller than or equal to 100 μm.

In the present embodiment, since the crossover portions 144 and 146 are disposed above the touch units 122, the insulation layer 130 is adopted to be disposed between the crossover portions 144 and 146 and the touch units 122, so as to prevent a short circuit between the crossover portions 144 and 146 and the touch units 122 underneath and accordingly a short circuit between the touch units 122 and the touch units 124 is avoided. As shown in FIG. 1, the insulation layer 130 includes a plurality of insulation patterns 132 and a plurality of insulation patterns 134, and the crossover portions 144 and the crossover portions 146 are respectively disposed on the insulation patterns 132 and the insulation patterns 134. As described above, through the disposition of the electric bridges 140, the touch units 124 are electrically connected with each other to form the touch series 124' extended along the direction Y. Further, because the insulation layer 130 is disposed below the electric bridges 140, a short circuit between the touch series 124' extended along the direction Y and the touch series 122' extended along the direction X can be avoided. Accordingly, the capacitive touch panel 100 in the present embodiment achieves a position sensing function in X-Y coordinates. Additionally, the insulation patterns 132 and the insulation patterns 134 are respectively disposed at both sides of the connecting sections 150 and are substantially perpendicular to the connecting sections 150. In the present embodiment, the geometric shape (for example, a rectangular shape) of the insulation patterns 132 may be the same as the geometric shape of the insulation patterns 134.

It should be mentioned that because the compensation portions 142 of the electric bridges 140 are disposed on the connecting sections 150 for electrically connecting the touch units 122, the connecting sections 150 and the compensation portions 142 can be considered as two resistors that are connected with each other in parallel, so that the resistance of the touch series 122' in the direction X can be reduced. Thereby, the layout structure of the capacitive touch panel 100 can improve the touch sensitivity of the capacitive touch panel 100 in the direction X. In the present embodiment, the connecting sections 150 may be made of ITO, and the compensation portions 142 may be made of ITO or a metal material. To be specific, because the resistance of metal is much smaller than that of ITO, when the connecting sections 150 are made of ITO while the compensation portions 142 are made of metal, the resistance of the connecting sections 150 is approximately equal to the resistance of the compensation portions 142 which is much smaller than the resistance of ITO.

On the other hand, because each electric bridge 140 includes two crossover portions 144 and 146, the impedance of the touch series 124' in the direction Y is half of that in a structure with only one crossover portion. Thus, the layout structure of the capacitive touch panel 100 can improve the touch sensitivity of the capacitive touch panel 100 in the direction Y.

Figure 2A:
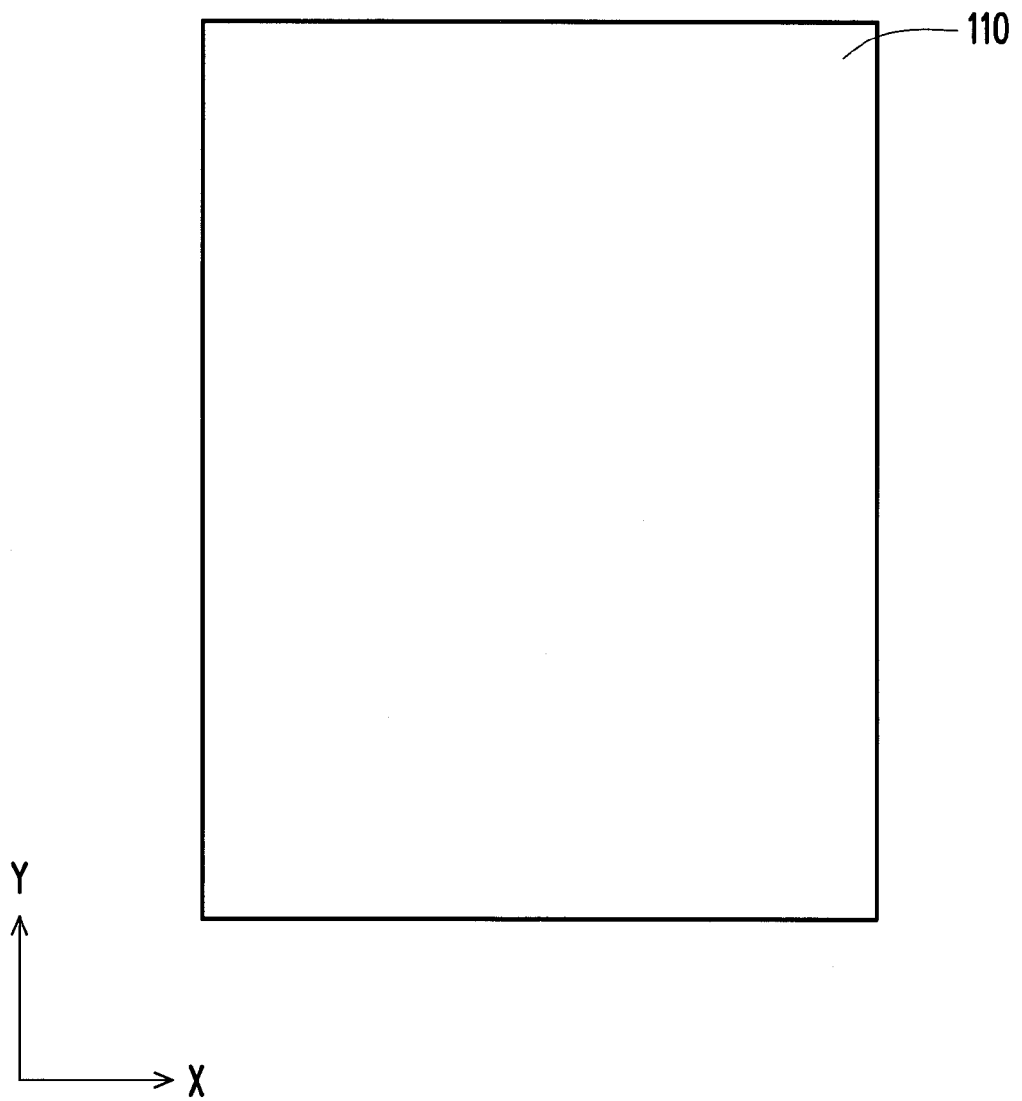
FIGS. 2A-2D are top views illustrating the manufacturing process of a capacitive touch panel having the layout structure in FIG. 1.
Figure 2B:
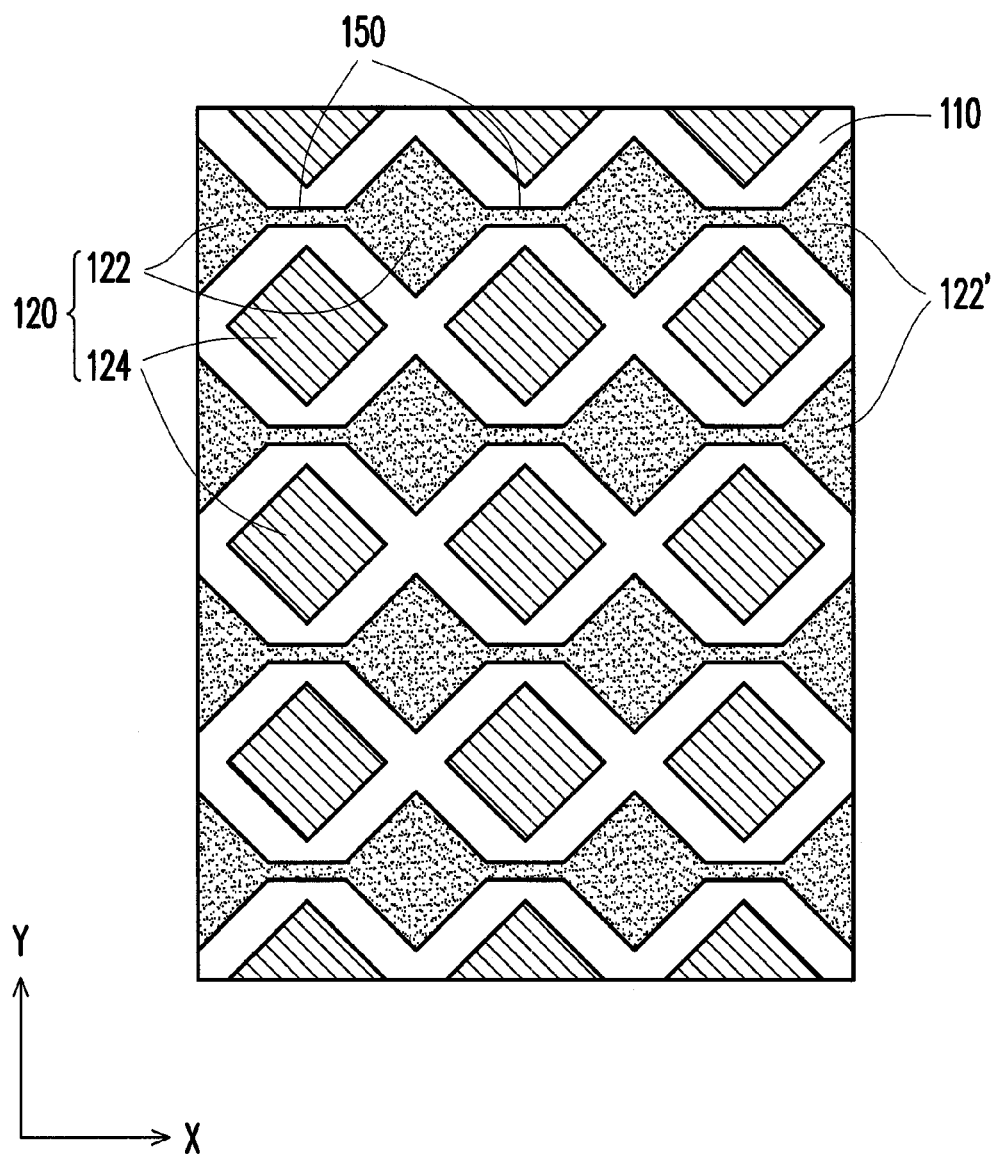

FIGS. 2A-2D are top views illustrating the manufacturing process of the capacitive touch panel 100 having the layout structure in FIG. 1. Referring to FIG. 2A, first, a substrate 110 is provided, and the substrate 110 may be a glass substrate. Then, as shown in FIG. 2B, a conductive layer 120 is disposed on the substrate 110, wherein the conductive layer 120 includes a plurality of touch units 122 and a plurality of touch units 124, and the touch units 122 are electrically connected with each other through a plurality of connecting sections 150 so as to form a plurality of touch series 122 extended along a first direction (for example, the direction X). In other words, in the present embodiment, the touch units 122 are short-circuited in the direction X, wherein the touch units 122 and the touch units 124 are made of ITO.

Figure 2C:
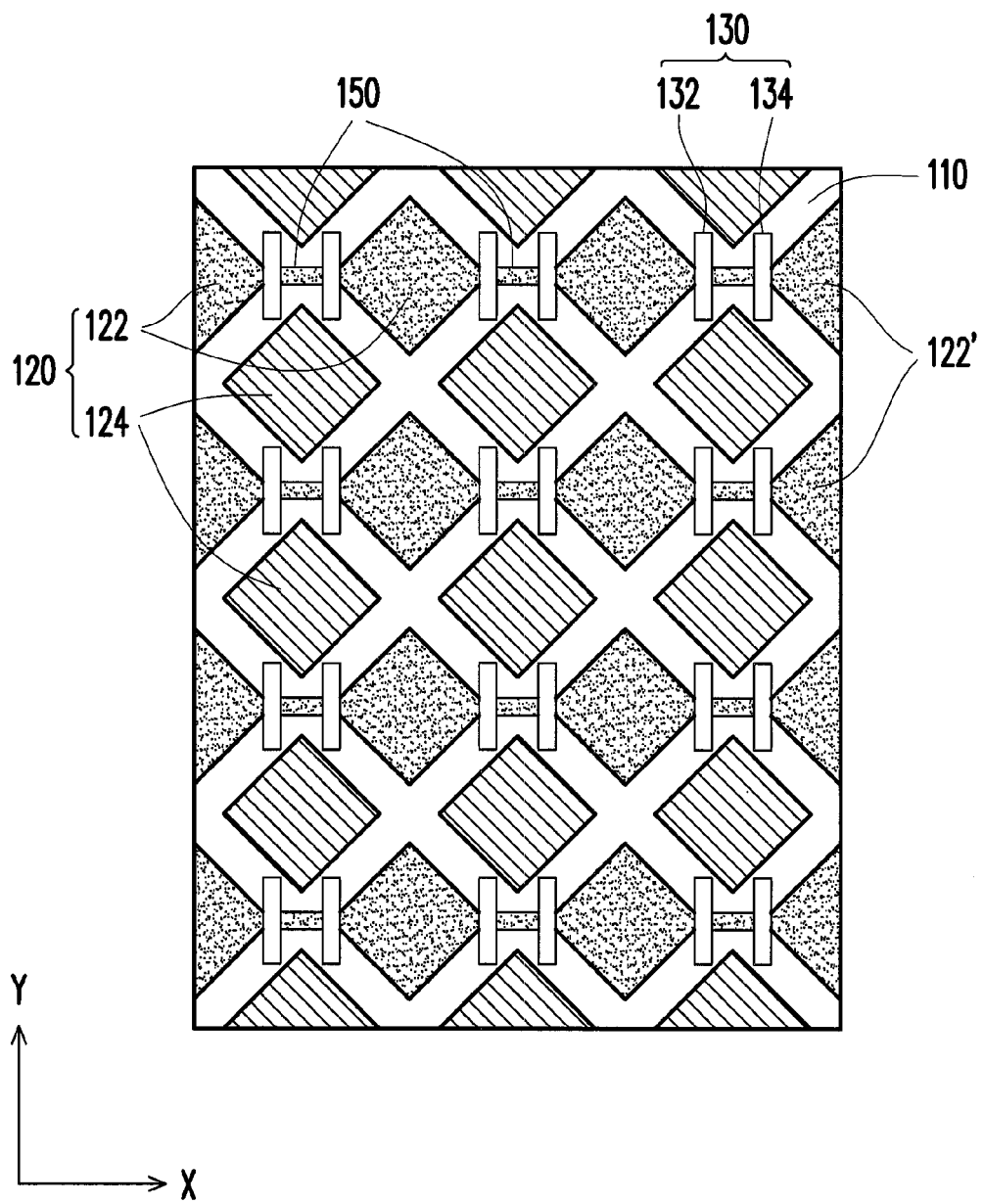

Next, referring to FIG. 2C, an insulation layer 130 is disposed on the conductive layer 120. The insulation layer 130 includes insulation patterns 132 and insulation patterns 134, and the insulation patterns 132 and 134 are extended along direction Y.

Figure 2D:
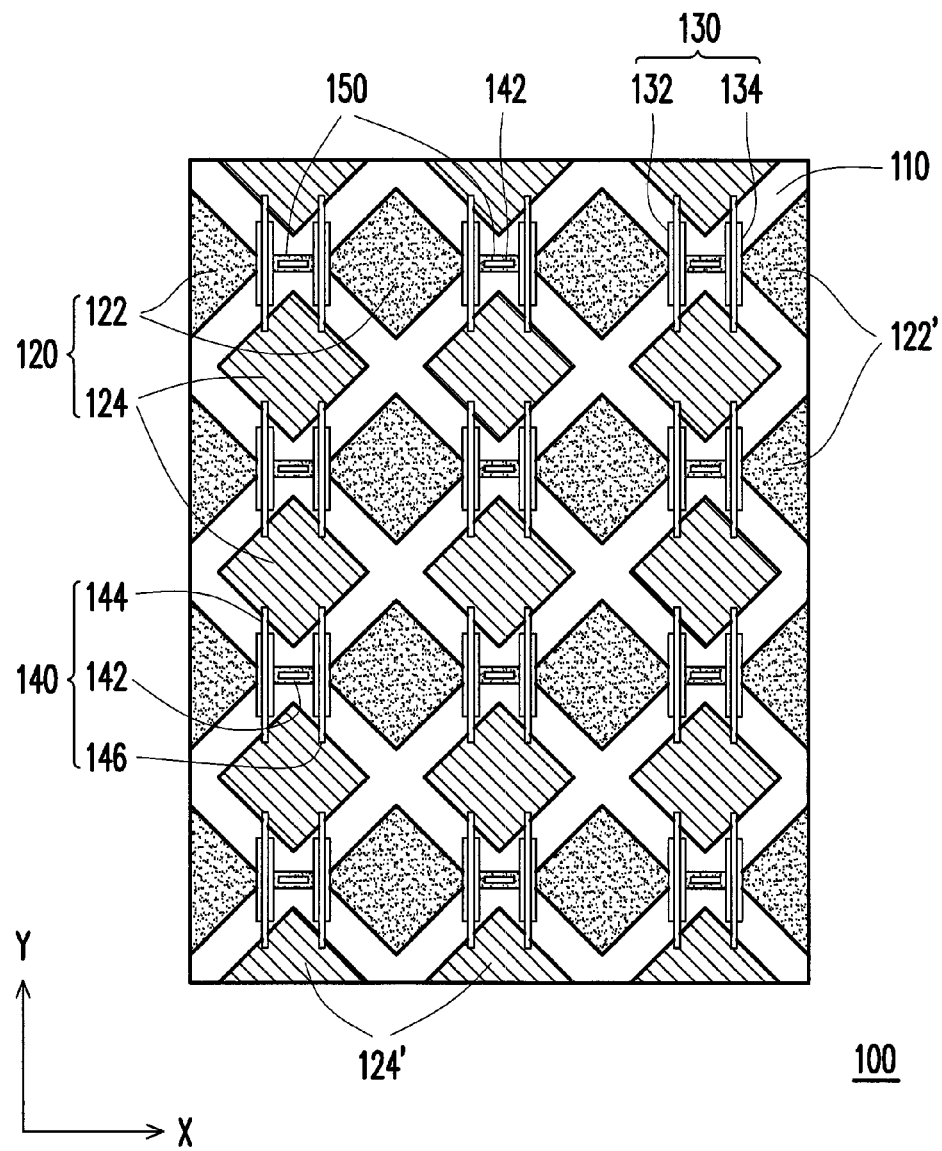

Thereafter, a plurality of electric bridges 140 is disposed on the conductive layer 120. As shown in FIG. 2D, each electric bridge 140 includes a compensation portion 142, a crossover portion 144, and a crossover portion 146. The compensation portions 142 are respectively disposed on the connecting sections 150, and the crossover portions 144 and the crossover portions 146 are disposed on the insulation layer 130. The touch units 124 are electrically connected with each other through the crossover portions 144 and the crossover portions 146 so as to form a plurality of touch series 124' extended along a second direction (for example, the direction Y). By now, the capacitive touch panel 100 having the layout structure as shown in FIG. 1 is completed, wherein the electric bridges 140 may be made of ITO or a metal material. To be specific, as shown in FIG. 2D, the electric bridge 140 between two touch units 124 has a H-shaped structure, wherein the crossover portions 144 and 146 are parallel to each other along the direction Y, and the compensation portion 142 is between the crossover portions 144 and 146 and is perpendicular to the crossover portions 144 and 146. The compensation portion 142 reduces the impedance of the touch series 122' in the direction X, and the crossover portions 144 and 146 reduce the impedance of the touch series 124' in the direction Y. The detailed layout structure of the capacitive touch panel 100 can be understood by referring to foregoing descriptions related to FIG. 1 therefore will not be described herein. It should be noted that in the step illustrated in FIG. 2D, the compensation portions 142 and the crossover portions 144 and 146 can be fabricated all together by using a single mask. Thus, the manufacturing method of the capacitive touch panel 100 provided by the present embodiment can reduce the number of masks used and simplify the manufacturing process.

Second Embodiment

Figure 3:
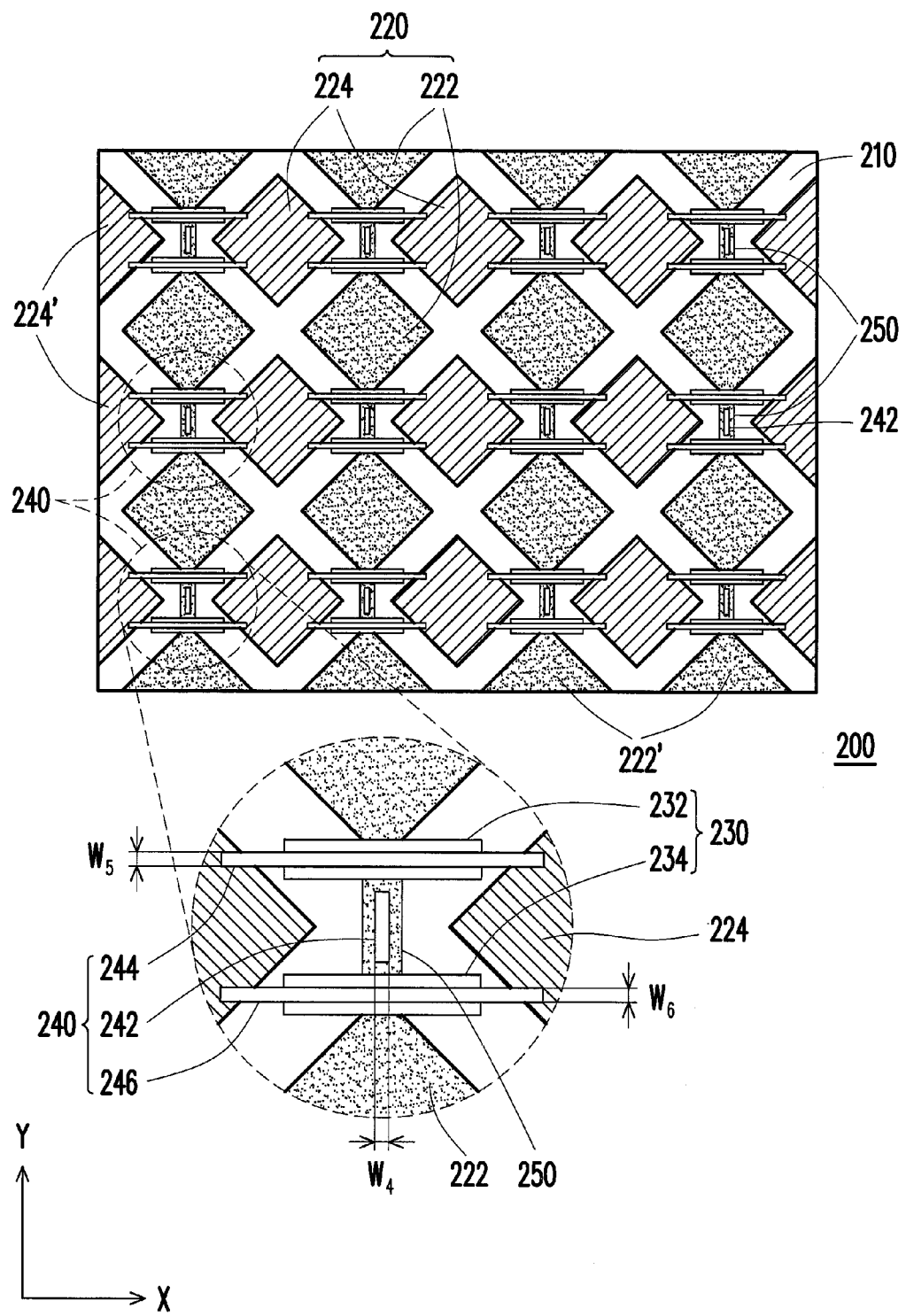
FIG. 3 is a diagram of a layout structure of a capacitive touch panel according to a second embodiment of the invention.

FIG. 3 is a diagram of a layout structure of a capacitive touch panel according to the second embodiment of the invention. The layout structure of the capacitive touch panel 200 illustrated in FIG. 3 is similar to the layout structure of the capacitive touch panel 100 illustrated in FIG. 1, and the major difference between the two layout structures is that in the present embodiment, the touch series 222' are extended along the direction Y, while the touch series 224' are extended along the direction X. In other words, in the present embodiment, the first direction is the direction Y, and the second direction is the direction X.

To be specific, the capacitive touch panel 200 in the present embodiment is a 5×4 capacitive touch panel. Namely, each touch series 222' includes four touch units 222, and each touch series 224' includes five touch units 224. The touch units 222 are electrically connected with each other through a plurality of connecting sections 250, so as to form a plurality of touch series 222' extended along the direction Y. In addition, the touch units 224 are electrically connected with each other through the crossover portions 244 and 246 of the electric bridges 240 so as to form a plurality of touch series 224' extended along the direction X. The crossover portions 244 and 246 are respectively disposed on the insulation patterns 232 and 234. In the present embodiment, the electric bridges 240 may be made of ITO or a metal material. When the electric bridges 240 are made of a metal material, in order to make the electric bridges 240 unnoticeable to human eyes, the width $W_4$ of the compensation portions 242, the width $W_5$ of the crossover portions 244, and the width $W_6$ of the crossover portions 246 may be designed as smaller than or equal to 100 μm.

As shown in FIG. 3, in the present embodiment, the crossover portions 244 and 246 between two touch units 224 are extended along the direction X and are parallel to each other. Additionally, the compensation portion 242 between the crossover portions 244 and 246 is perpendicular to the crossover portions 244 and 246. Namely, in the present embodiment, the compensation portions 242 are extended along the direction Y. Similarly, the compensation portions 242 can reduce the impedance of the touch series 222' in the direction Y, and by adopting the structure with two crossover portions 244 and 246, the impedance of the touch series 224' in the direction X can also be reduced. Thereby, the layout structure of the capacitive touch panel 200 in the present embodiment can improve the touch sensitivity of the capacitive touch panel 200.

Figure 4A:
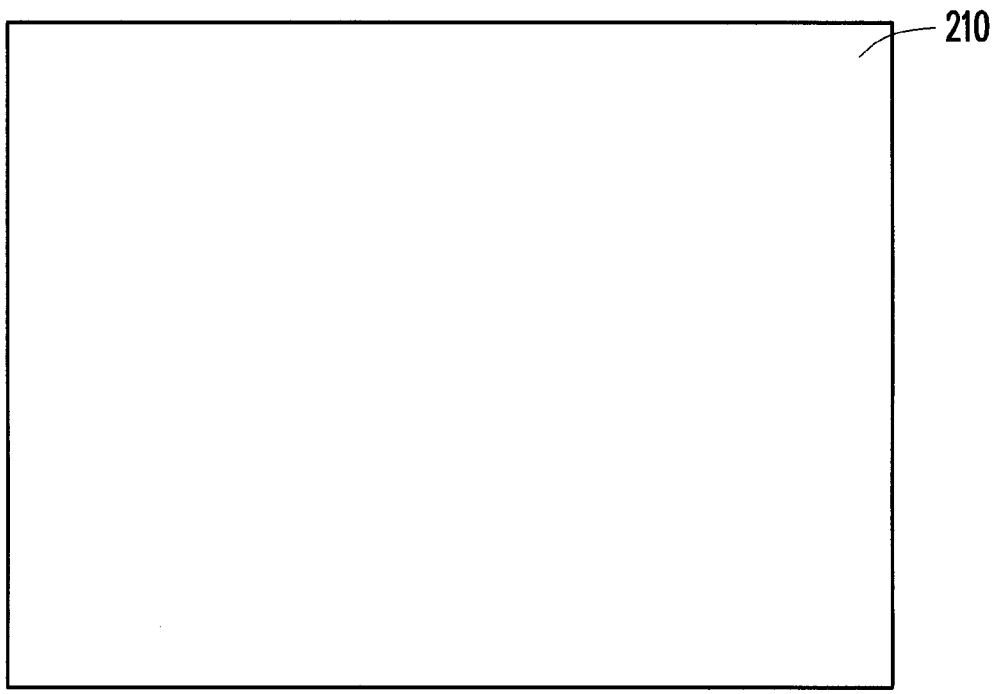
FIGS. 4A-4D are top views illustrating the manufacturing process of a capacitive touch panel having the layout structure in FIG. 3.
Figure 4A:
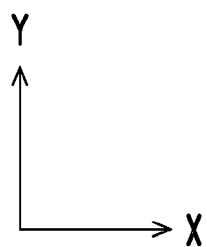
Figure 4B:
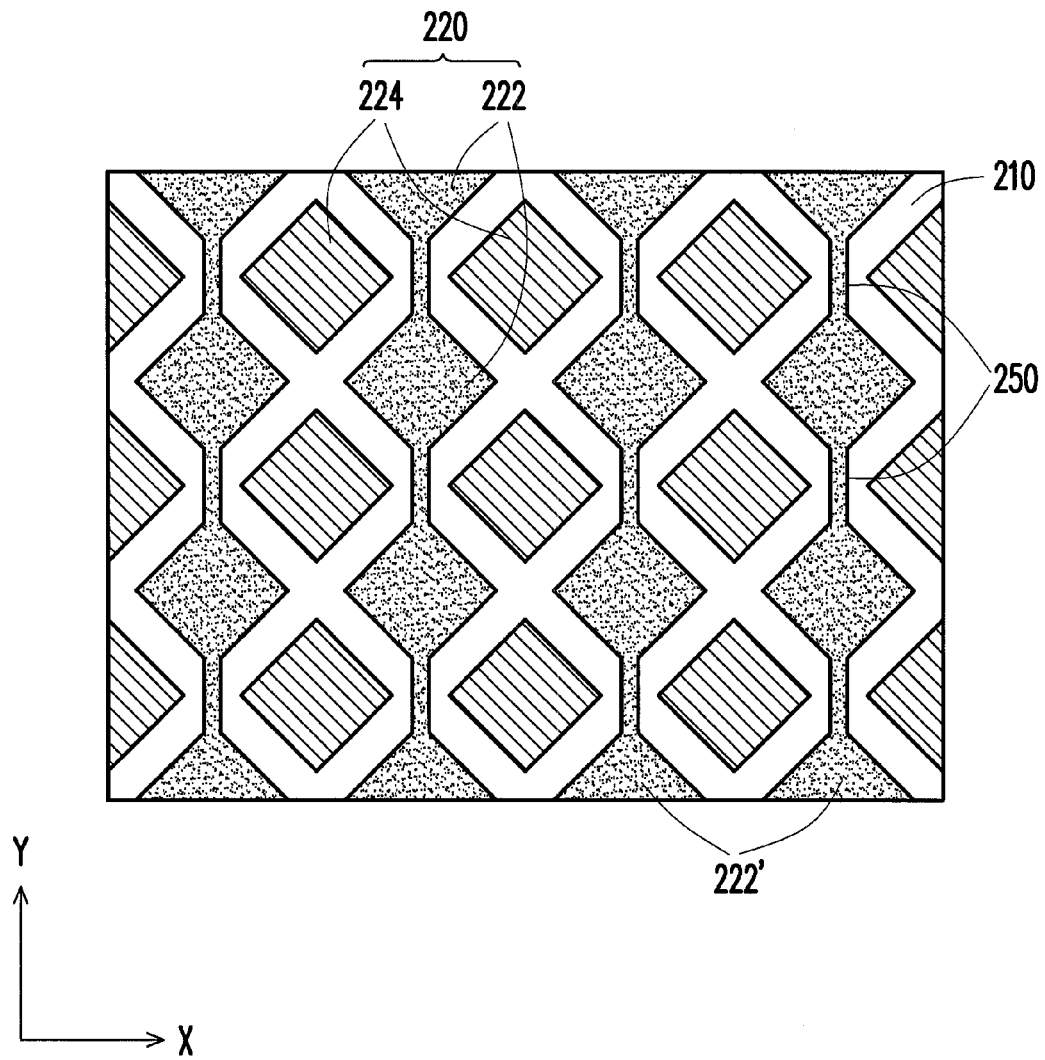

FIGS. 4A-4D are top views illustrating the manufacturing process of the capacitive touch panel 200 having the layout structure in FIG. 3. Referring to FIG. 4A, first, a substrate 210 is provided, and the substrate 210 may be a glass substrate. Then, as shown in FIG. 4B, a conductive layer 220 is disposed on the substrate 210. The conductive layer 220 includes a plurality of touch units 222 and a plurality of touch units 224, and the touch units 222 are electrically connected with each other through a plurality of connecting sections 250, so as to form a plurality of touch series 222 extended along a first direction (for example, the direction Y). In other words, in the present embodiment, the touch units 222 are already short-circuited in the direction Y, wherein the touch units 222 and the touch units 224 may be made of ITO.

Figure 4C:
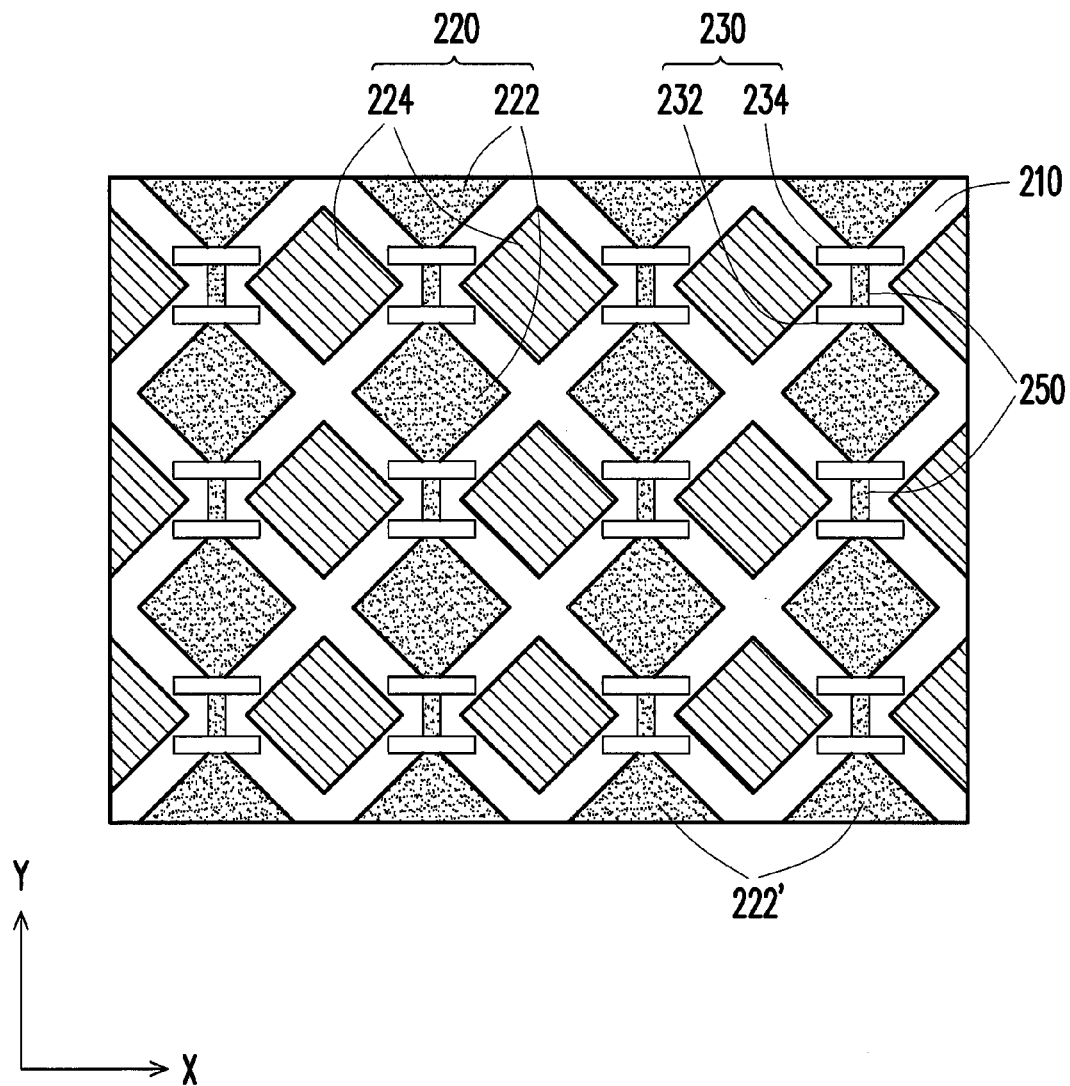

Next, referring to FIG. 4C, an insulation layer 230 is disposed on the conductive layer 220. The insulation layer 230 includes insulation patterns 232 and insulation patterns 234, wherein the insulation patterns 232 and 234 are extended along the direction X.

Figure 4D:
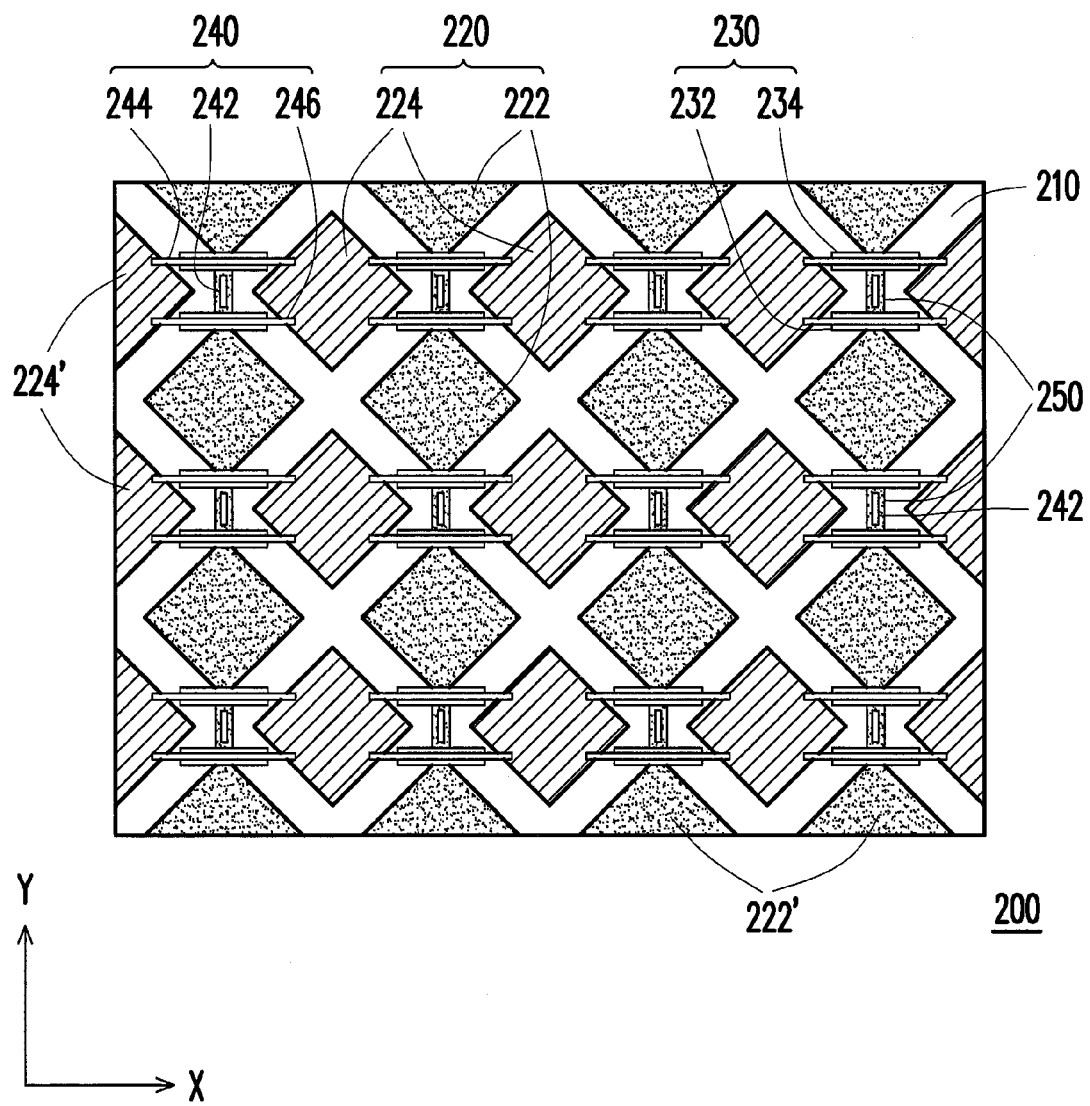

Thereafter, a plurality of electric bridges 240 is disposed on the conductive layer 220. As shown in FIG. 4D, each electric bridge 240 includes a compensation portion 242, a crossover portion 244, and a crossover portion 246. The compensation portions 242 are respectively disposed on the connecting sections 250, and the crossover portions 244 and the crossover portions 246 are disposed on the insulation layer 230. The touch units 224 are electrically connected with each other through the crossover portions 244 and the crossover portions 246 so as to form a plurality of touch series 224' extended along a second direction (for example, the direction X). By now, the layout structure of the capacitive touch panel 200 in FIG. 3 is completed. The detailed layout structure of the capacitive touch panel 200 can be understood by referring to the first embodiment described above therefore will not be described herein again.

In summary, in the embodiments of the invention, since the electric bridges respectively having the compensation portion and two crossover portions are disposed on the touch units, the impedances of the touch series in both the first direction and the second direction can be reduced. Accordingly, the touch sensitivity of the capacitive touch panel can be improved. Moreover, because the compensation portions and the crossover portions can be fabricated through the same fabricating process, the layout structure provided by the embodiments of the invention can reduce the number of masks used, simply the manufacturing process, reduce the manufacturing cost.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A manufacturing method of a capacitive touch panel, comprising:

providing a substrate;

disposing a conductive layer on the substrate, wherein the conductive layer comprises a plurality of first touch units and a plurality of second touch units, and the first touch units are electrically connected with each other through a plurality of connecting sections so as to form a plurality of first touch series extended along a first direction;

disposing an insulation layer on the conductive layer; and disposing a plurality of electric bridges on the conductive layer after the second touch units of the conductive layer have been formed, wherein each of the electric bridges comprises a compensation portion, a first crossover portion, and a second crossover portion, the compensation portions are respectively disposed on the connecting sections, the first crossover portions and the second crossover portions are disposed on the insulation layer, and the second touch units are electrically connected with each other through the first crossover portions and the second crossover portions so as to form a plurality of second touch series extended along a second direction.

2. The manufacturing method according to claim 1, wherein the insulation layer comprises a plurality of first insulation patterns and a plurality of second insulation patterns, and the first crossover portions and the second crossover portions are respectively disposed on the first insulation patterns and the second insulation patterns.

3. The manufacturing method according to claim 2, wherein the first insulation patterns and the second insulation patterns are respectively disposed at both sides of the connecting sections and are substantially perpendicular to the connecting sections.

4. The manufacturing method according to claim 1, wherein the compensation portion is located between the first crossover portion and the second crossover portion and is substantially perpendicular to the first crossover portion and the second crossover portion.

5. The manufacturing method according to claim 1, wherein a geometric shape of the first crossover portion is the same as a geometric shape of the second crossover portion.

6. The manufacturing method according to claim 1, wherein widths of the compensation portion, the first crossover portion, and the second crossover portion are all smaller than or equal to 100 μm.

* * * * *